US007816907B2

(12) United States Patent
Schwarzer et al.

(10) Patent No.: US 7,816,907 B2
(45) Date of Patent: Oct. 19, 2010

(54) INTEGRATED CIRCUIT WITH A MEASURING CIRCUIT AND METHOD OF CONFIGURING AN INTEGRATED CIRCUIT WITH A MEASURING CIRCUIT

(75) Inventors: Christoph Schwarzer, Munich (DE); Holger Wenske, Freising (DE); Mario Träber, Deisenhofen (DE); Thomas Eichler, Unterhaching (DE); Marc Hesener, Munich (DE); Armin Hanneberg, Haar (DE); David Herbison, Munich (DE)

(73) Assignee: Lantiq Deutschland GmbH, Neubiberg (DE)

( * ) Notice: Subject to any disclaimer, the term of this patent is extended or adjusted under 35 U.S.C. 154(b) by 178 days.

(21) Appl. No.: 12/107,802

(22) Filed: Apr. 23, 2008

(65) Prior Publication Data

US 2009/0267681 A1 Oct. 29, 2009

(51) Int. Cl.
*G01R 31/02* (2006.01)

(52) U.S. Cl. .................................... 324/158.1; 324/765

(58) Field of Classification Search ....................... None
See application file for complete search history.

(56) References Cited

U.S. PATENT DOCUMENTS 5,629,635 A 5/1997 Reno
6,515,506 B1 2/2003 Lo
6,564,161 B1 * 5/2003 Lin et al. .................... 702/117
7,111,218 B2 * 9/2006 Egger et al. ................. 714/733
7,382,148 B2 * 6/2008 Dang et al. ................. 324/767
2009/0284237 A1 * 11/2009 Kitagawa et al. ............ 323/282

* cited by examiner

*Primary Examiner*—Vinh P Nguyen
(74) *Attorney, Agent, or Firm*—Coats & Bennett, P.L.L.C.

(57) ABSTRACT

An integrated circuit includes an output terminal to be coupled to a light-emitting diode, an output circuit coupled to the output terminal, the output circuit being configured to supply an operating signal to the light-emitting diode, a measuring circuit coupled to the output terminal and a control circuit coupled to the measuring circuit. The measuring circuit is configured to sense on the output terminal a signal value outside an operating regime of the light-emitting diode, the signal value being a voltage below a forward voltage of the light-emitting diode or a current below a threshold current of the light-emitting diode. The control circuit is configured to configure at least one function of the integrated circuit when the signal value as sensed by the measuring circuit corresponds to a voltage below the forward voltage of the light-emitting diode or a current below the threshold current of the light-emitting diode.

25 Claims, 8 Drawing Sheets

INTEGRATED CIRCUIT WITH A MEASURING CIRCUIT AND METHOD OF CONFIGURING AN INTEGRATED CIRCUIT WITH A MEASURING CIRCUIT

BACKGROUND OF THE INVENTION

The present invention relates to an integrated circuit and to a method of configuring an integrated circuit. The invention further relates to an electronic device comprising the integrated circuit, e.g. a communication device.

In electronic devices, e.g. in data communication devices, there is typically a need to configure components of the electronic device. In this respect, it is known to configure one or more integrated circuits during an initialization phase. For example, operating modes of an integrated circuit can be selected or communication addresses may be transferred to the integrated circuit. This may be accomplished on the basis of data stored in memory devices such as EPROMs (EPROM: Electrically Programmable Read Only Memory) or from the firmware of a microcontroller. In other cases, the data may be defined by an external circuit configuration coupled to the integrated circuit, such as jumpers, dip switches or the like. In each case, it is typically necessary to provide the integrated circuit with additional connection pins or terminals for receiving the configuration data.

SUMMARY OF THE INVENTION

According to an embodiment, the present invention provides an integrated circuit comprising an output terminal to be coupled to a non-linear circuit element, an output circuit coupled to the output terminal, the output circuit being configured to supply an operating signal to the non-linear circuit element, a measuring circuit coupled to the output terminal, the measuring circuit being configured to sense on the output terminal a signal value outside an operating regime of the non-linear circuit element, and a control circuit coupled to the measuring circuit, the control circuit being configured to configure at least one function of the integrated circuit on the basis of the signal value sensed by the measuring circuit.

DETAILED DESCRIPTION OF THE INVENTION

The following detailed description explains exemplary embodiments of the present invention. The description is not to be taken in a limiting sense, but is made only for the purpose of illustrating the general principles of the invention. It is to be understood that the scope of the invention is only defined by the claims and is not intended to be limited by the exemplary embodiments described hereinafter. Further, it is to be understood that in the following detailed description of exemplary embodiments any shown or described direct connection or coupling between two functional blocks, devices, components or other physical or functional units could also be implemented by indirect connection or coupling.

In the following, embodiments of the invention will be described with reference to the accompanying drawings. The embodiments described hereinafter relate to an integrated circuit and to an electronic device comprising the integrated circuit. The electronic device may be a communication device configured to transmit electronic data via a communication network, and the integrated circuit may be configured to provide a physical layer interface to the communication network. For example, the integrated circuit may be configured to operate according to the Ethernet specification, the Fast Ethernet specification, the Gigabit Ethernet specification or the like. However, the concepts as described hereinafter could also be applied to other types of integrated circuits.

Figure 1:
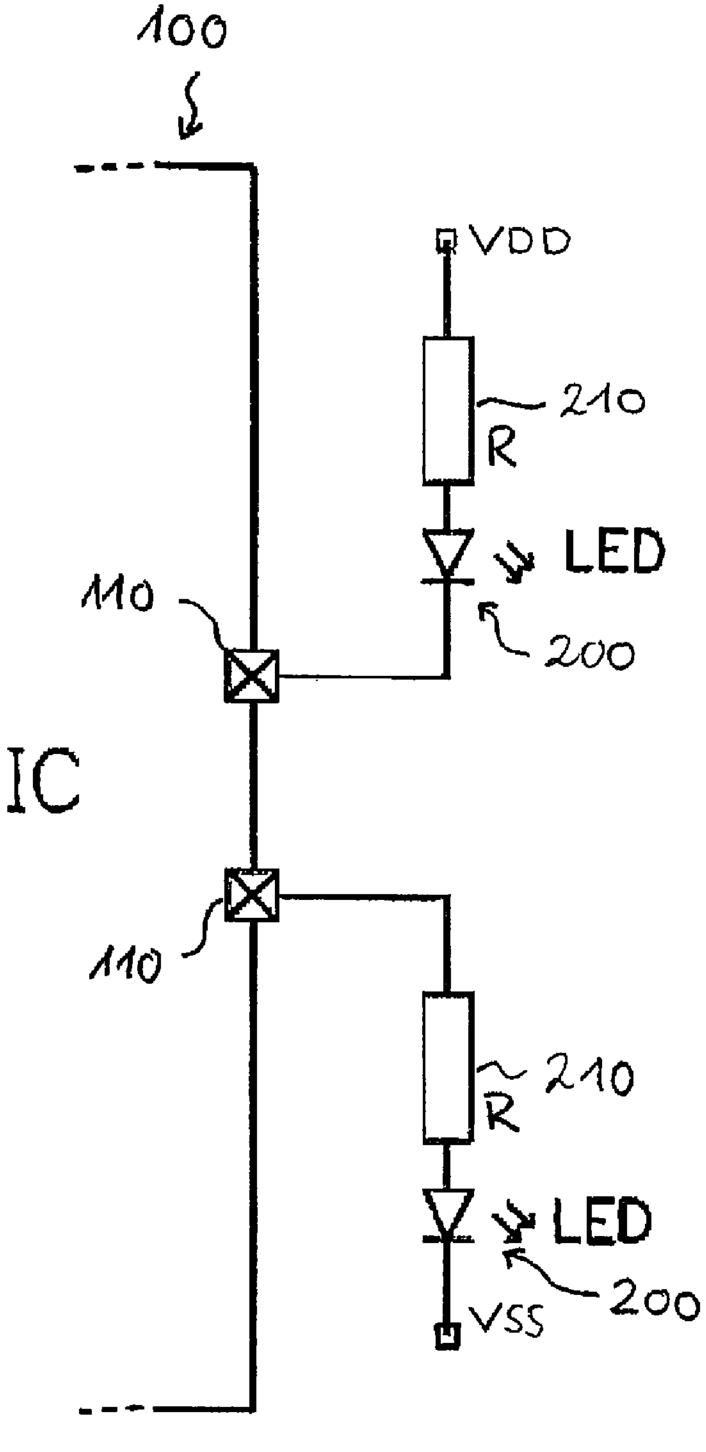
FIG. 1 schematically illustrates an integrated circuit according to an embodiment of the invention.

FIG. 1 illustrates an integrated circuit (IC) 100 according to an embodiment of the invention. As illustrated, the integrated circuit comprises output terminals 110 which are configured to provide coupling to an external non-linear circuit element 200 with a light-emitting diode (LED). As illustrated, the non-linear circuit element 200 may be coupled between a high supply voltage VDD and the output terminal 110 or between the output terminal 110 and a low supply voltage VSS. The non-linear circuit elements 200 each further comprise a resistor 210 coupled in series to the light-emitting diode. The output terminals 110 may also be referred to as connection pins.

Operation of the light-emitting diodes is controlled by the integrated circuit 100 by supplying a corresponding operating signal via the output terminals 110. By means of the operating signal, the light-emitting diodes are controlled to operate so as to irradiate light. In this respect, it is to be understood that the irradiated light may be in the visible range. However, it is also possible that the irradiated light is outside the visible range, e.g. in the infrared range.

According to the embodiment, the output terminals 110 of the integrated circuit 100 are further configured to transfer configuration data from the outside to the integrated circuit 100. This is accomplished by measuring a signal value on at least one of the output terminals 110. In particular, the integrated circuit 100 is configured to measure signal values on the output terminals 110 which are outside an operating regime of the non-linear circuit elements 200 coupled to the output terminals 110. In this way, the signal values used for transferring the configuration data do not interfere with the normal operation of the non-linear circuit elements 200. In the illustrated case of a non-linear circuit element comprising a light-emitting diode, it is avoided that the light-emitting diode irradiates light due to the signal values used when transferring the configuration data. By commonly using the output terminals 110 both for operating the light-emitting diodes and for receiving configuration data, the pin count of the integrated circuit may be reduced.

Figure 2:
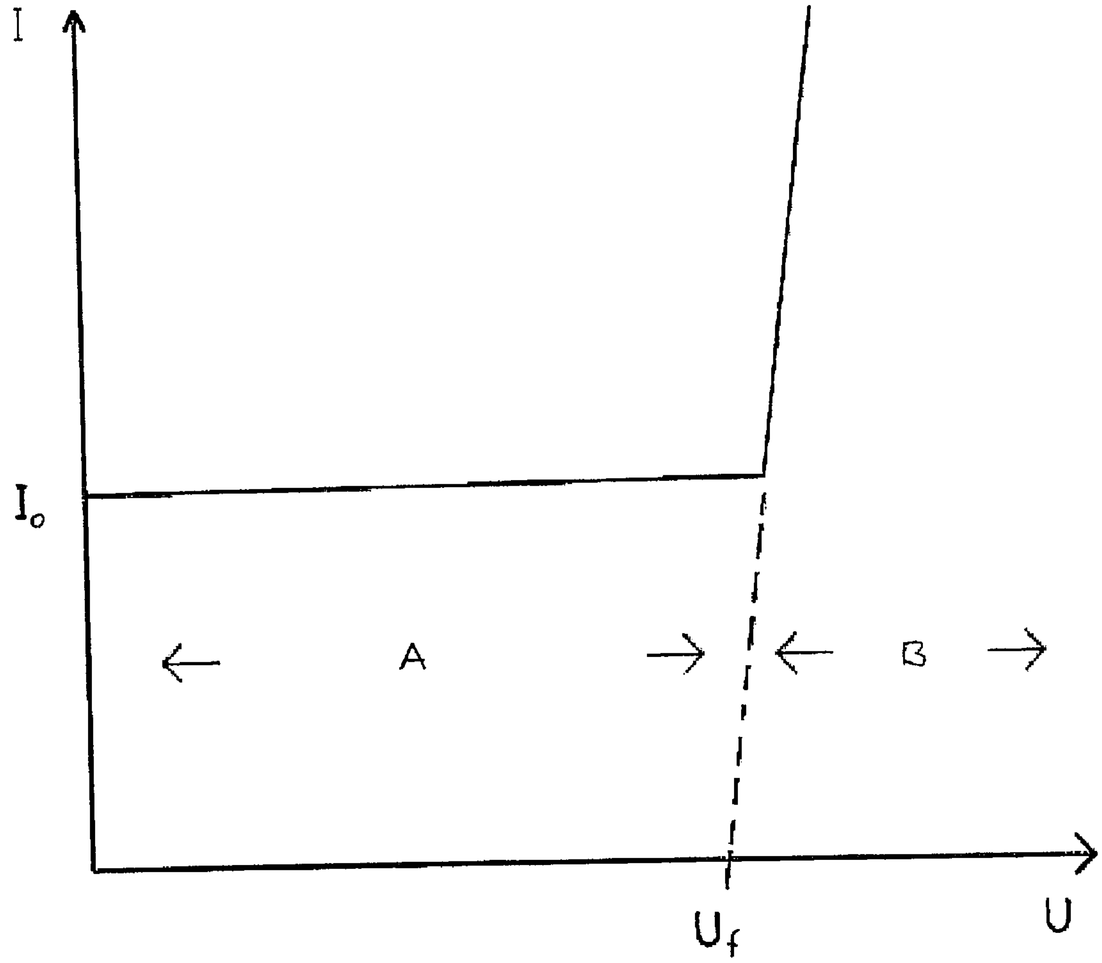
FIG. 2 shows an exemplary current-voltage characteristic of a non-linear circuit element comprising a light-emitting diode.

FIG. 2 shows an exemplary current-voltage characteristic of a non-linear circuit element with a light-emitting diode as used in a method of transferring configuration data according to an embodiment of the invention.

As illustrated, the current-voltage characteristic is highly non-linear and comprises a first regime denoted by A in which there is substantially no increase of the current I as function of the voltage U. In a second regime, denoted by B, there is a strong increase of the current I as a function of the voltage U. In case of a light-emitting diode, the threshold voltage between the first regime A and the second regime B is typically denoted as a forward voltage $U_f$. Beyond the forward voltage $U_f$, the current I starts to rapidly increase from a threshold current $I_o$. The second regime B, in which the voltage U is above the forward voltage $U_f$ and in which the current I is above the threshold current $I_o$ may also be referred to as the operating regime of the non-linear circuit element, as the intended operation of the non-linear circuit element in case of a light-emitting diode is that light is irradiated by the light-emitting diode only in the second regime B. Accordingly, the first regime A may also be referred to as non-operating regime.

Accordingly, in the integrated circuit 100 as illustrated in FIG. 1, the signal value sensed on the output terminals 110 may be voltages below the forward voltage $U_f$ or currents below the threshold current $I_o$.

Figure 3:
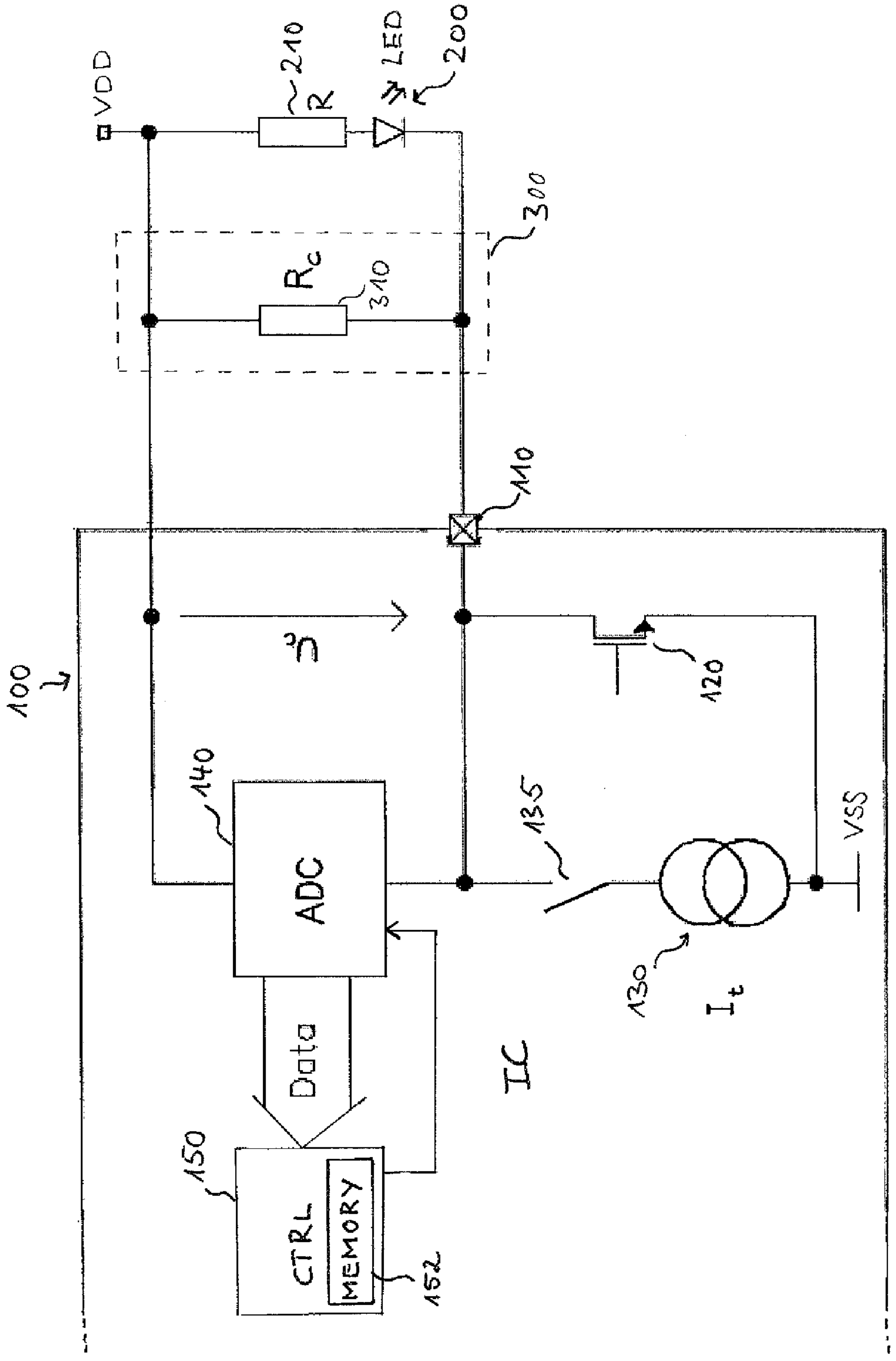
FIG. 3 schematically illustrates an implementation of an integrated circuit according to an embodiment of the invention.

FIG. 3 schematically illustrates an implementation of the integrated circuit 100. In this case, only one of the output terminals 110 is illustrated. However, it is to be understood that further output terminals 110 may be provided.

As illustrated, the integrated circuit 100 comprises an output circuit configured to supply an operating signal to the non-linear circuit element 200 via the output terminal 110. As the non-linear circuit element 200 essentially consists of a light-emitting diode, the output circuit may also be referred to as a light-emitting diode driver. In the illustrated example, the output circuit is formed by a transistor 120 coupled between the output terminal 110 and the low supply voltage VSS. The non-linear circuit element 200 is coupled between the output terminal 110 and the high supply voltage VDD. By switching the transistor 120 into its conducting state, a current will flow through the non-linear circuit element 200, causing the light-emitting diode to irradiate light. The value R of the series resistor 210 is selected in such a way that the current which is caused to flow in this state is above the threshold value $I_o$. Accordingly, a voltage as measured between the high supply voltage VDD and the output terminal 110 is above the forward voltage $U_f$ of the light-emitting diode.

As further illustrated, the integrated circuit comprises a measuring circuit which is configured to measure a voltage on the output terminal 110 when the non-linear circuit element 200 is outside its operating regime. This voltage is externally set by a configuration circuit 300 coupled to the output terminal 110. In the illustrated example, the configuration circuit 300 comprises a configuration resistor 310 coupled in parallel to the non-linear circuit element 200. Accordingly, when the non-linear circuit element 200 is outside its operating regime, the current will flow substantially through the configuration resistor 310, causing a voltage drop between the high supply voltage VDD and the output terminal 110 which is proportional to the value $R_c$, of the configuration resistor 310. In the following, this voltage drop will be referred to as configuration voltage $U_c$.

For sensing the configuration voltage $U_c$, the integrated circuit 100 comprises an analog-to-digital converter (ADC) 140, which has a first, positive input coupled to the high supply voltage VDD and a second, negative input coupled to the output terminal 110. Further, the measuring circuit comprises a test signal source 130 in the form of a current sink coupled between the output terminal 110 and the low supply voltage VSS. The test signal source 130 is configured to supply a test signal to the output terminal 110, in this case in the form of a test current $I_t$ flowing through the output terminal 110 to the low supply voltage VSS. In addition, the measuring circuit comprises a switch 135 for decoupling the test signal source 130 from the output terminal 110.

Further, the integrated circuit 100 comprises a control circuit (CTRL) 150 which is configured to control a configuration process of the integrated circuit 100. In particular, the control circuit 150 is configured to receive digital data from the analog-to-digital converter 140. In the control circuit 150, the received digital data may be stored as configuration data and then be used for controlling configuration of at least function of the integrated circuit 100, e.g., selecting address values, selecting between different operating modes, or the like. In this respect, it is to be noted that, as the signal value sensed on the output terminal 110 is an analog value, actually multiple bits of configuration data may be received via only one output terminal. For storing the configuration data, the control circuit 150 may comprise a suitably designed memory 152. Alternatively, it is also possible that the digital data is stored as configuration data in a memory so as to be accessible by the control circuit 150, i.e. that the data is transferred to the control circuit via the memory.

For the purpose of controlling the configuration process, the control circuit 150 supplies a corresponding control signal to the analog-to-digital converter 140. By means of the control signal, the analog-to-digital converter 140 may be caused to measure the signal value on the output terminal 110 and to supply the corresponding digital data to the control circuit 150. Further, the switch 135 and the transistor 120 are controlled by the control circuit 150. In normal operation of the integrated circuit 100, the output circuit is selectively activated by controlling the transistor 120 into its conducting state, and the test signal source 130 is deactivated by controlling the switch 135 to be open. In this way, the measuring circuit does not interfere with the normal operation of the integrated circuit 100 with respect to supplying an operating signal to the non-linear circuit element 200, e.g. for causing the light-emitting diode to flash or to be substantially continuously activated.

In a configuration state, e.g. during an initialization phase of the integrated circuit 100, the output circuit is deactivated by controlling the transistor 120 into its non-conducting state and by activating the test signal source 130 by controlling the switch 135 into its closed state.

The test signal source 130 is configured in such a way that the signal value of the test signal, in this case the test current $I_t$, is outside the operating regime of the non-linear circuit element 200 coupled to the output terminal 110. In particular, the value of the test current $I_t$ selected in such a way that the voltages $U_c$ which occur across the non-linear circuit element 200 are below the forward voltage $U_f$ of the light-emitting diode. The value of the test current $I_t$ may be selected in such a way that for a given set of possible values $R_c$ of the configuration resistor 310, the test current $I_t$ multiplied by the resistance $R_c$ is below 1 V. According to an embodiment, the value of the test current $I_t$ is selected to be equal to or below 100 μA. According to some embodiments, the test current may even be selected to be equal to or below 10 μA. In this way, the light-emitting diode will not operate during the configuration process and glowing or flashing of the light-emitting diode during the configuration process, which may be disturbing or irritating, can be avoided.

As mentioned above, the value of the configuration voltage $U_c$ which is measured during the configuration process is determined by the value of the configuration resistor 310 in the configuration circuit 300. That is to say, the configuration data transmitted to the integrated circuit 100 is controlled by suitably selecting the configuration circuit 300. This may also include leaving out the configuration resistor 310 or entire configuration circuit 300. The values $R_c$ of the configuration resistor may be selected in a range between 100Ω and 100 kΩ. According to an embodiment, the values $R_c$ of the configuration resistor 310 may be selected in a range between 500Ω and 15 kΩ. For example, by defining four different resistance values in this range, two bits of configuration data may be encoded. The measured value of the configuration voltage $U_c$ is typically below 1 V.

It is to be understood that the implementation of the integrated circuit 100 as illustrated in FIG. 3 is merely one example. In FIGS. 4A, 4B, 4C and 4D different alternative implementations are illustrated. In these figures, components corresponding to those of FIGS. 1 and 3 have been designated with the same reference signs and it will be refrained from repeatedly describing these components. In particular, FIGS. 4A, 4B, 4C and 4D illustrate different measuring modes of the signal value on the output terminal 110. Accordingly, only those components which more or less take part in the measurement process are illustrated in the figures. It is to be understood, that additional components, such as an analog-to-digital converter, a control circuit, a switch, and an output circuit as illustrated in FIG. 3 may be present as well. Further, in these figures the configuration circuit 300 is more generally illustrated to comprise a configuration impedance 320 having an impedance value $Z_c$. As can be seen, the concepts of transferring configuration data as described above are thus not limited to using ohmic configuration resistors. For example, it would also be possible to use a combination of an ohmic configuration resistor and of a capacitor so as to implement a configuration impedance. It is also possible to use more than one configuration resistor and/or configuration capacitor in the configuration circuit.

Figure 4A:
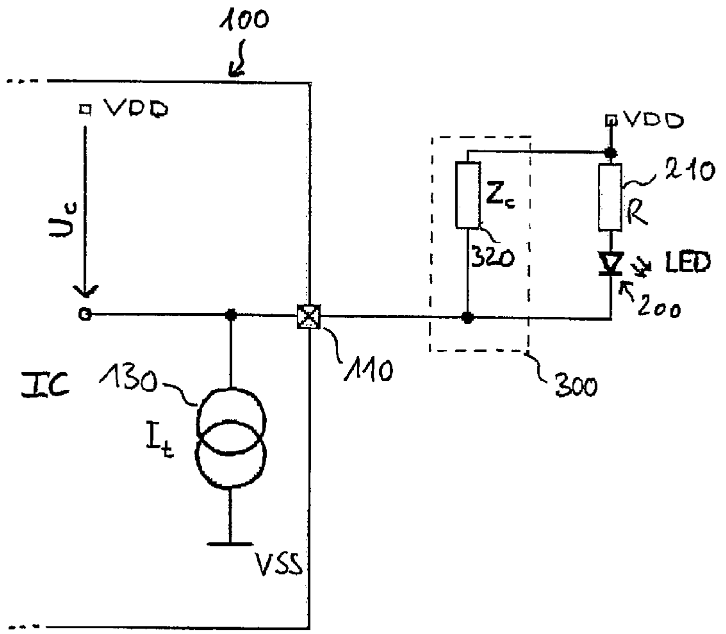
FIGS. 4A, 4B, 4C and 4D schematically illustrate alternative implementations of an integrated circuit according to an embodiment of the invention.

The measurement mode as illustrated in FIG. 4A substantially corresponds to that as explained in connection with FIG. 3. That is to say, the measuring circuit comprises a test signal source 130 configured to supply a test current $I_t$ and is configured to measure a voltage between the high supply voltage VDD and the output terminal 110. The non-linear circuit element 200 and the configuration circuit 300 are coupled between the high supply voltage VDD and the output terminal 110. According to an embodiment, the value of the test current is selected to be equal to or below 100 μA. According to some embodiments, the test current may even be selected to be equal to or below 10 μA. The measured value of the configuration voltage $U_c$ is typically below 1 V.

Figure 4B:
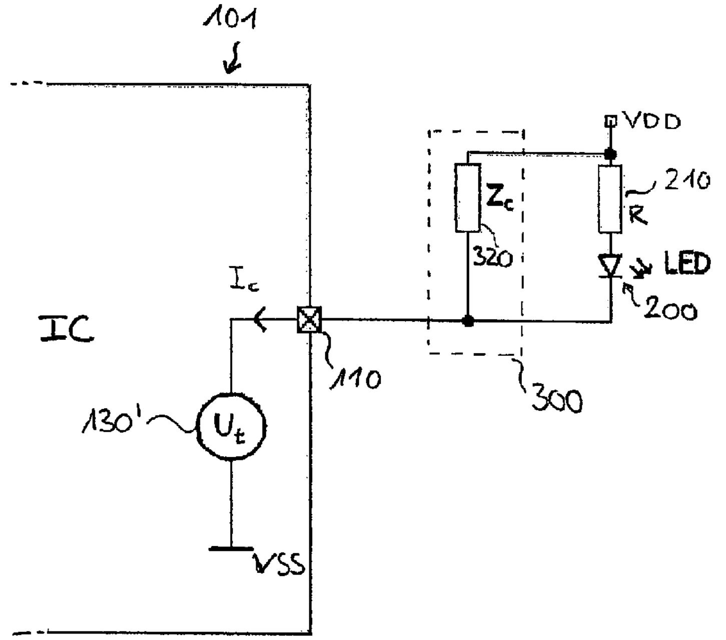

In FIG. 4B, an implementation is illustrated in which an integrated circuit 101 comprises a measuring circuit which is configured to measure a current flowing through the output terminal 110. In this case, the measuring circuit comprises a test signal source 130' in the form of a voltage source coupled between the output terminal and the low supply voltage VSS. The test signal source 130' is configured to supply a test voltage $U_t$ to the output terminal 110 which is below the forward voltage $U_f$ of the light-emitting diode in the non-linear circuit element 200. The value of the configuration current $I_c$ which is measured on the output terminal 110 during the configuration process is determined by the value $Z_c$ of the configuration impedance 320, which is coupled to the output terminal 110 in parallel to the non-linear circuit element 200. The non-linear circuit element 200 and the configuration circuit 300 are coupled between the high supply voltage VDD and the output terminal 110. According to an embodiment, the value of the test voltage $U_t$ is selected to be equal to or below 1 V. The measured value of the configuration current $I_c$ is typically below 10 mA. In some embodiments, depending on the selected value of the test voltage $U_t$, the measured value of the configuration current $I_c$ is typically below 100 μA.

In FIGS. 4A and 4B the configuration of the output circuit, i.e. the light-emitting diode driver, can be similar as illustrated in FIG. 3.

Figure 4C:
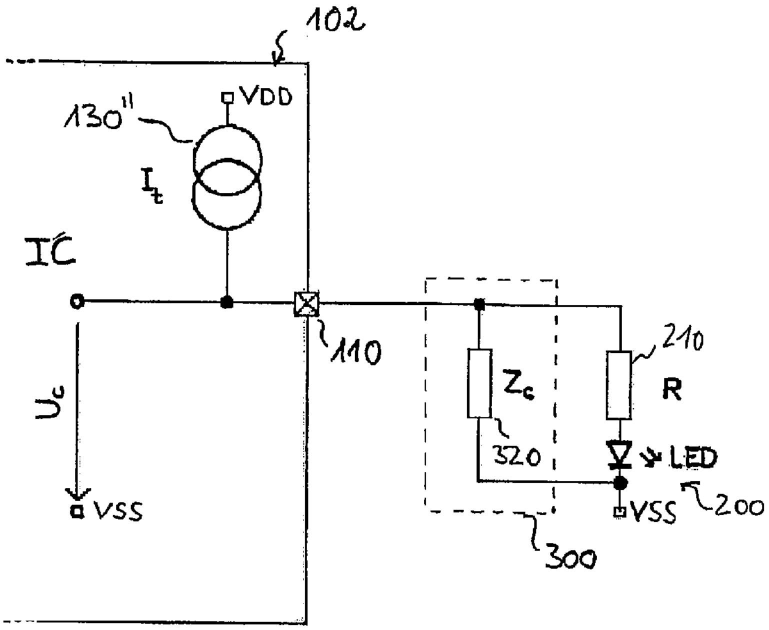

In FIG. 4C, an implementation of an integrated circuit 102 is illustrated in which the measuring circuit is configured to measure a configuration voltage $U_c$ between the output terminal 110 and the low supply voltage VSS. In this case, the measuring circuit comprises a test signal source 130" which is coupled between the high supply voltage VDD and the output terminal 110 and is configured to supply a test current $I_t$ through the output terminal 110, i.e. is configured as a current source. The non-linear circuit element 200 and the configuration circuit 300 are coupled between the output terminal 110 and the low supply voltage VSS. According to an embodiment, the value of the test current $I_t$ is selected to be below 100 μA. In some embodiments, the value of the test current may even be selected to be equal to or below 10 μA. The measured value of the configuration voltage $U_c$ is typically below 1 V.

Figure 4D:
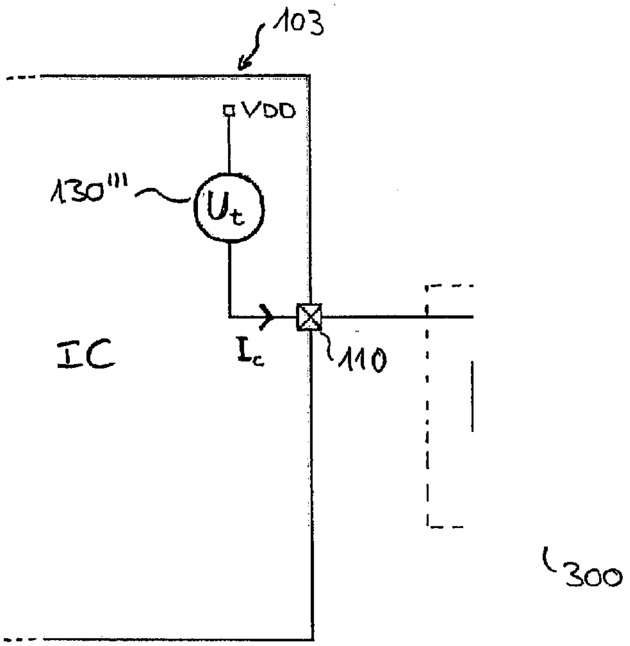

In FIG. 4D, an implementation of an integrated circuit 103 is illustrated, in which a measuring circuit is configured to measure a configuration current $I_c$ flowing through the output terminal 110. The measuring circuit comprises a test signal source 130''' which comprises a voltage source coupled between the high supply voltage VDD and the output terminal 110. The test signal source 130''' is configured to supply a test voltage $U_t$ to the output terminal 110. In FIG. 4D, the non-linear circuit element 200 and the configuration circuit 300 are coupled between the output terminal 110 and the low supply voltage VSS. According to an embodiment, the value of the test voltage $U_t$ is selected to be equal to or below 1 V. The measured value of the configuration current $I_c$ is typically below 10 mA. In some embodiments, depending on the selected value of the test voltage, the measured value of the configuration current $I_c$ is typically below 100 μA.

In FIGS. 4C and 4D, the output circuit, i.e. the light-emitting diode driver, may be implemented by coupling a transistor between the high supply voltage VDD and the output terminal 110.

In the different measuring modes as illustrated in FIGS. 4A, 4B, 4C and 4D, in each case an analog signal value is measured by the measuring circuit which is defined by the value $Z_c$ of the configuration impedance 320 in the configuration circuit 300. By means of the analog value, a plurality of bits of the configuration data can be encoded. In each case, the value of the test signal ($I_t$ or $U_t$) is selected in such a way that it is outside the operating regime of the non-linear circuit element 200. In particular, the values of the test current $I_t$ or of the test voltage $U_t$ may in each case be selected in such a way that no voltage is generated across the non-linear circuit element 200 which is above the forward voltage $U_f$ of the light-emitting diode.

Figure 5:
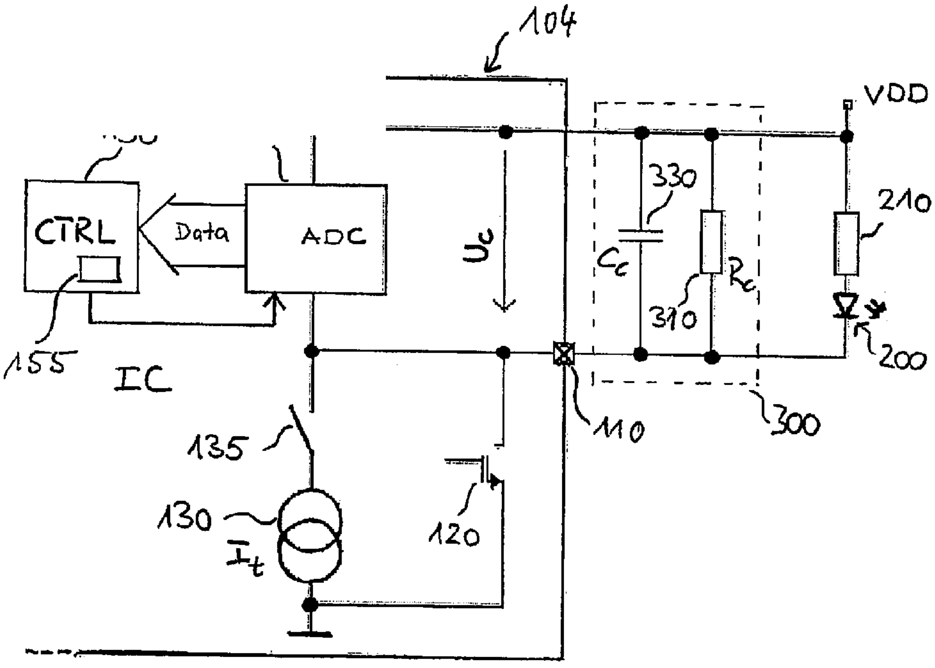
FIG. 5 schematically illustrates an integrated circuit according to a further embodiment of the invention.

FIG. 5 schematically illustrates the implementation of an integrated circuit 104 according to a further embodiment of the invention. The integrated circuit 104 generally corresponds to the implementation of the integrated circuit 100 as illustrated in FIG. 3. In FIG. 5, components corresponding to those as illustrated in FIG. 3 have been designated with the same reference signs and it will be refrained from giving a repeated description thereof. In the following, only the differences as compared to the integrated circuit of FIG. 3 will be explained.

As illustrated in FIG. 5, the configuration circuit 300 comprises, in addition to the configuration resistor 310, a configuration capacitor 330. The configuration capacitor 330 is optionally coupled in parallel to the configuration resistor 310. In general, the value $C_c$ of the configuration capacitor 330 will determine the time evolution of the signal value as measured on the output terminal 110 during the configuration process. The measuring circuit of the integrated circuit 104 is configured to evaluate this time evolution. For this purpose, the control circuit 150 additionally comprises a timer 155 which controls the analog-to-digital converter to measure the signal value on the output terminal 110 at least two different points of time relative to a point of time at which the test signal supplied by the test signal source 130 is activated using the switch 135.

Figure 6:
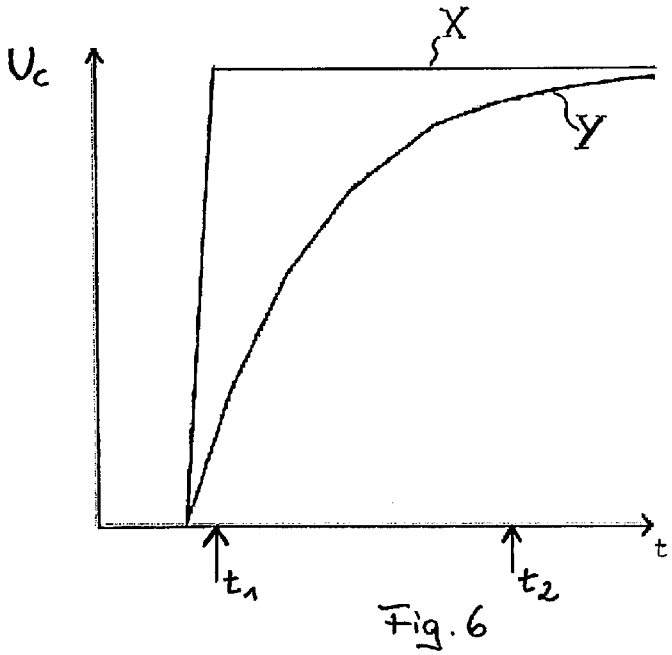
FIG. 6 schematically illustrates exemplary time evolutions of signal values on an output terminal of the integrated circuit of FIG. 5.

Two exemplary courses of the signal value on the output terminal 110 as a function of time t are illustrated in FIG. 6. A first course, denoted by X, corresponds to a situation in which the configuration circuit 300 does not comprise the configuration capacitor 330. Accordingly, when activating the test signal, the signal value substantially immediately rises to a maximum value which is determined by the value $R_c$ of the configuration resistor 310. A second course is denoted by Y and corresponds to a situation in which the configuration capacitor 330 is present in the configuration circuit 300. In this case, the signal value on the output terminal 110 more slowly approaches the maximum value which is determined by the value $R_c$ of the configuration resistor 310.

Accordingly, by measuring the signal value on the output terminal 110 at two different points of time relative to activating the test signal, it is possible to distinguish whether the configuration capacitor 330 is present in the configuration circuit 300 or not. Of course, it would also be possible to distinguish between two different values of the configuration capacitor 330. Furthermore, e.g. by introducing additional points of time for the measurement, it may even be possible to distinguish between more than two different values of the configuration capacitor 330.

Encoding of the transferred configuration data may be accomplished by using selected values $R_c$ of the configuration resistor and the value $C_c$ of the configuration capacitor. According to one example, the configuration resistor 310 may be selected from the E96 series and may have one of eight values of $R_c$ selected from the following group: 0.93 kΩ, 1.62 kΩ, 2.43 kΩ, 3.40 kΩ, 4.64 kΩ, 6.04 kΩ, 7.87 kΩ, 10.00 kΩ. The value $C_c$ of the configuration capacitor may be 100 nF. The coding of a four-bit configuration data word transferred via a single out-put terminal may then be as follows:

A value of $R_c$=0.93 kΩ may correspond to a binary data word of 000.

A value of $R_c$=1.62 kΩ may correspond to a binary data word of 0001.

A value of $R_c$=2.43 kΩ may correspond to a binary data word of 010.

A value of $R_c$=3.40 kΩ may correspond to a binary data word of 011.

A value of $R_c$=4.64 kΩ may correspond to a binary data word of 100.

A value of $R_c$=6.04 kΩ may correspond to a binary data word of 101.

A value of $R_c$=7.87 kΩ may correspond to a binary data word of 110.

A value of $R_c$=10.00 kΩ may correspond to a binary data word of 111.

The fourth bit may be encoded by the presence or non-presence of the configuration capacitor 330. For example, a binary word of 1001 could thus be encoded by a value $R_c$ of 1.62 kΩ with the configuration capacitor 330 present in the configuration circuit 300.

It is to be understood that each of the measuring modes illustrated in FIGS. 4A, 4B, 4C, and 4D could alternatively be used in the integrated circuit 104 of FIG. 5.

Figure 7:
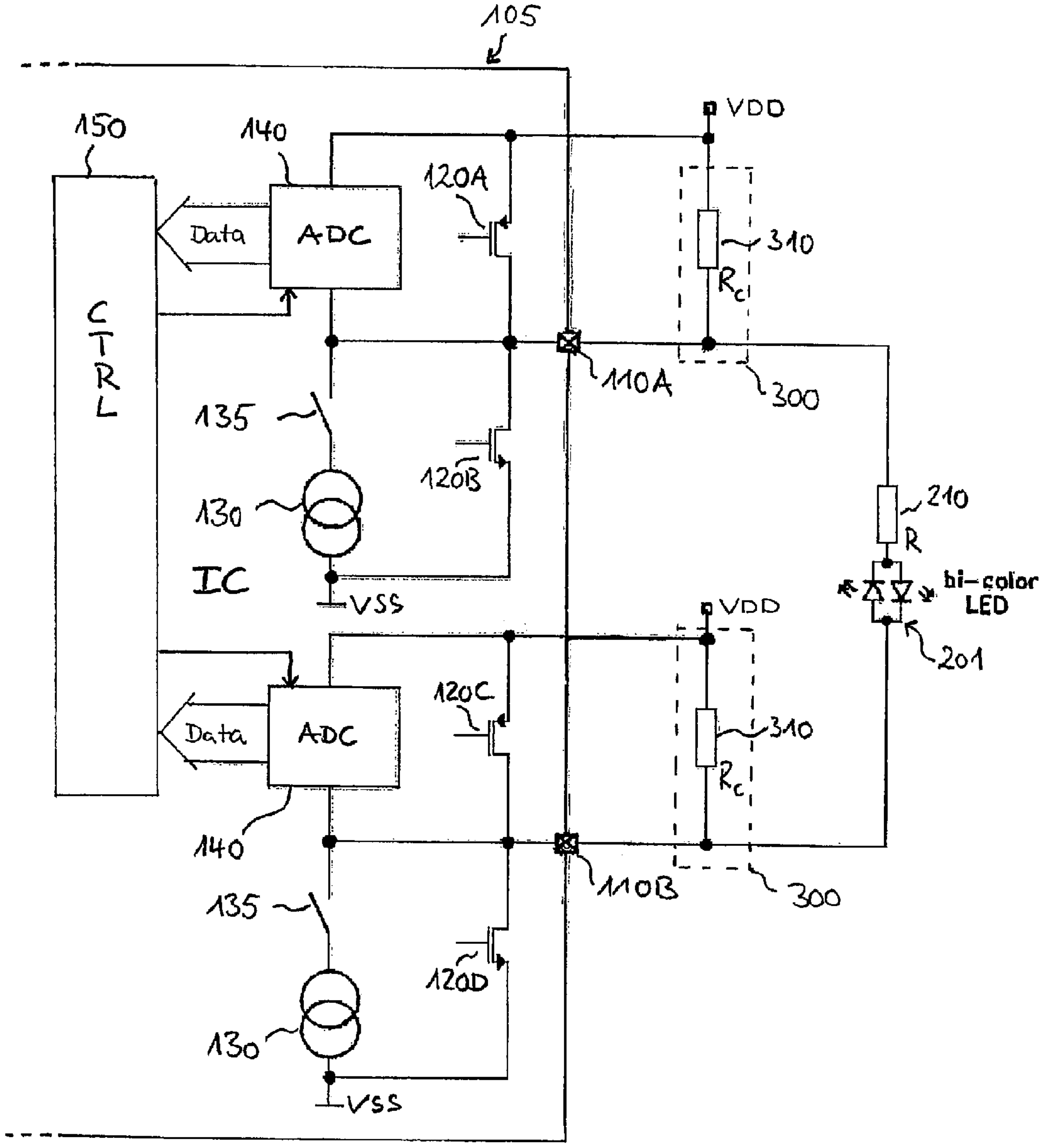
FIG. 7 schematically illustrates an integrated circuit according to a further embodiment of the invention.

FIG. 7 schematically illustrates an implementation of an integrated circuit 105 according to a further embodiment of the invention. In FIG. 7, components corresponding to those of FIG. 3 and FIG. 5 have been designated with the same reference signs, and it will be refrained from giving a repeated description thereof. In the following, the main differences of the integrated circuit 105 as compared to the integrated circuits 100 and 104 of the FIGS. 3 and 5 will be described.

As illustrated, the integrated circuit 105 is configured to be operated with a multicolor light-emitting diode, in particular a bi-color light-emitting diode. That is to say, the non-linear circuit element 201 as illustrated in FIG. 7 comprises a bi-color light-emitting diode and a series resistor 210. The non-linear circuit element 201 is configured to be coupled between two output terminals 110A, 110B of the integrated circuit 105. For each of the output terminals 110A, 110B a corresponding output circuit, i.e. light-emitting diode driver, is provided within the integrated circuit 105 for supplying operating signals of the non-linear circuit element 201. According to the illustrated example, an output circuit coupled to the output terminal 110A comprises a first transistor 120A coupled between the high supply voltage VDD and the output terminal 110A, and a second transistor 120B coupled between the output terminal 110A and the low supply voltage VSS. Similarly, an output circuit coupled to the output terminal 110B comprises a first transistor 120C coupled between the high supply voltage VDD and the output terminal 110B and a second transistor 120D coupled between the output terminal 110B and the low supply voltage.

By means of the output circuits comprising the transistors 120A, 120B, 120C, 120D it is possible to supply an operating signal to the non-linear circuit element 201 which causes either a current to flow from the output terminal 110A through the non-linear circuit element 201 to the output terminal 110B or which causes a current to flow from the output terminal 110B through the non-linear circuit element 201 to the output terminal 110A. Depending on the direction of the current, the bi-color light-emitting diode of the non-linear circuit element 201 irradiates light with one of two different colors.

As further illustrated, a configuration circuit 300 is coupled to each of the output terminals 110A, 110B. Each of the configuration circuits 300 comprises a configuration resistor 310 coupled between the high-supply voltage VDD and the output terminal 110A or the output terminal 110B, respectively. It is to be understood, that instead of the configuration resistor 310 also a configuration impedance or a combination of a configuration resistor and a configuration capacitor as illustrated in FIGS. 4A, 4B, 4C, 4D and 5 could be used. Further, it is to be understood that each of the measuring modes illustrated in FIGS. 4A, 4B, 4C, and 4D could alternatively be used in the integrated circuit 105 of FIG. 7.

As further illustrated, the integrated circuit 105 comprises a measuring circuit with a test signal source 130, a switch 135, and an analog-to-digital converter 140 for each of the output terminals 110A, 110B. A single control circuit 150 is provided for receiving the digital data from both analog-to-digital converters 140 and for controlling the configuration process with respect to both output terminals 110A, 110B. The structure of the measuring circuit and its operation during the configuration process are substantially the same as explained in connection with FIG. 3. However, the control circuit 150 now evaluates the digital data received via both output terminals 110A, 110B. Accordingly, the total number of bits which is transferred may be increased. Further, the control circuit 150 may also evaluate whether there is a bi-color light-emitting diode coupled between the output terminals 110A, 110B or if a single-color light-emitting diode is coupled to each of the output terminals 110A, 110B. For example, the control circuit 150 may select different operating modes of the output circuits, i.e. of the light-emitting diode drivers, depending on this information.

Figure 8:
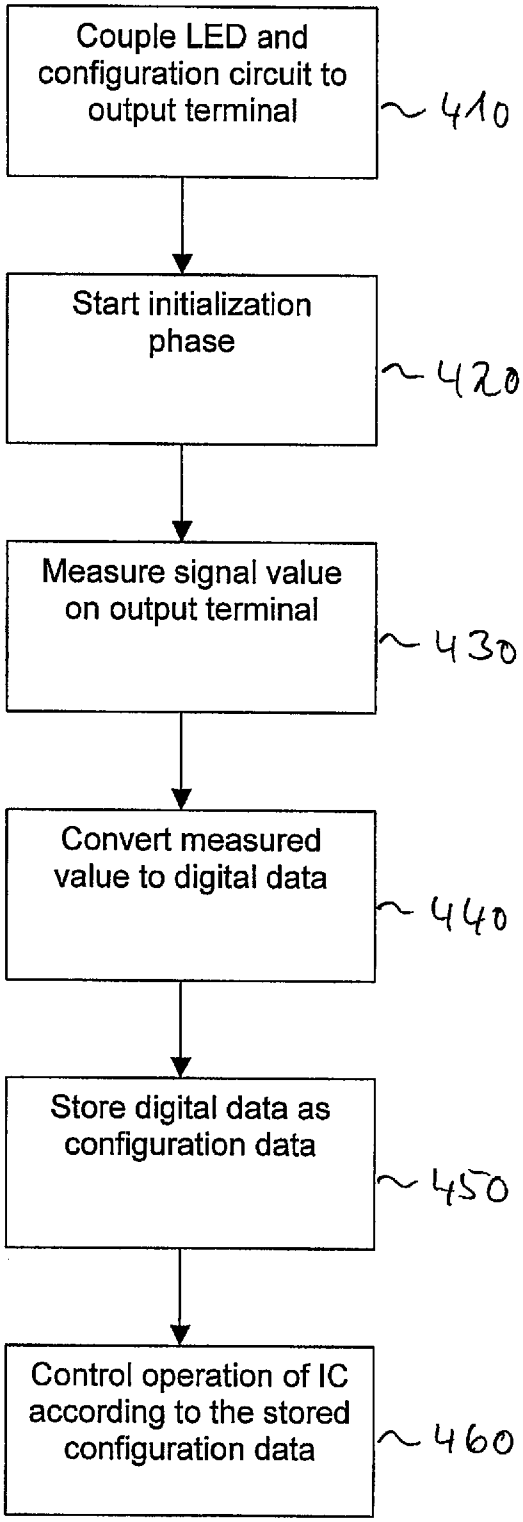
FIG. 8 shows a flow chart which illustrates a method of configuring an integrated circuit according to an embodiment of the invention.

FIG. 8 shows a flow-chart which illustrates a method of configuring an integrated circuit according to the above-explained principles. The method may be performed using each of the above integrated circuits 100, 101, 102, 103, 104, 105.

The method starts with step 410, in which an electronic device, such as a communication device, is assembled and a non-linear circuit element comprising a light-emitting diode and a configuration circuit are coupled to an output terminal of the integrated circuit. For example, the integrated circuit, the non-linear circuit element, and the configuration circuit may be assembled on a printed circuit board. At this stage, the configuration circuit is selected so as to suitably encode the desired configuration data. In fact, this procedure may be performed for all light-emitting diode output terminals of the integrated circuit, which increases the amount of configuration data which can be transferred.

The method then continues with step 420, which is performed in the assembled state of an electronic device, e.g. during each start-up of the electronic device. In step 420 an initialization phase of the electronic device is started. This initialization phase also includes a configuration process in which the configuration data encoded by the configuration circuit (or circuits) coupled to the output terminal (or output terminals) are transferred to the integrated circuit. The configuration process includes steps 430, 440, and 450.

In step 430, the signal value on each output terminal is measured with a test signal being supplied to the non-linear circuit element and to the configuration circuit in such a way that the non-linear circuit element remains outside its operating regime. The measured signal value may be an analog voltage or an analog current, as explained in connection with FIGS. 4A, 4B, 4C, and 4D.

In step 440, the measured signal value is converted to digital data.

In step 450 the digital data is stored as configuration data. This may be accomplished by using a suitably designed semiconductor memory. After that, circuitry used in steps 430-450 may be deactivated and the integrated circuit is switched to normal operation. With respect to the output terminal (or output terminals), the integrated circuit then operates in a light-emitting diode driver mode.

In step 460, the operation of the integrated circuit is controlled according to the stored configuration data. For example, different operating modes, e.g. operation according to different communication protocols, may be selected. Another possibility is to select between different operating modes with respect to controlling light-emitting diodes coupled to the output terminals, e.g. to select between different flash patterns or sequences. Further, a communication address of the integrated circuit may be set according to the configuration data.

It is to be understood that various modifications are possible within the above-described exemplary embodiments of the invention. For example, various features of the different embodiments may be combined with each other as appropriate. For example, different measuring modes as illustrated in FIGS. 4A, 4B, 4C, and 4D may be combined with each other on a single integrated circuit. Further, the output terminals may be other output terminals than light-emitting diode pins. In fact, the concepts as explained above may be used in connection with any non-linear circuit element which is to be coupled to an integrated circuit and comprises a well-defined operating regime. In addition, the above-mentioned measuring modes are merely exemplary and the invention is not limited thereto. Other measuring modes, for example on the basis of measuring a frequency characteristic, could be implemented as well.

The invention claimed is:

1. An integrated circuit, comprising:

an output terminal to be coupled to a light-emitting diode, an output circuit coupled to the output terminal, the output circuit being configured to supply an operating signal to the light-emitting diode, a measuring circuit coupled to the output terminal, the measuring circuit being configured to sense on the output terminal a signal value outside an operating regime of the light-emitting diode, the signal value being a voltage below a forward voltage of the light-emitting diode or a current below a threshold current of the light-emitting diode, and a control circuit coupled to the measuring circuit, the control circuit being configured to configure at least one function of the integrated circuit when the signal value as sensed by the measuring circuit corresponds to a voltage below the forward voltage of the light-emitting diode or a current below the threshold current of the light-emitting diode.

2. The integrated circuit according to claim 1, wherein the output circuit comprises a light-emitting diode driver.

3. The integrated circuit according to claim 1, wherein the measuring circuit comprises an analog-to-digital converter configured to convert the sensed signal value into a digital value.

4. The integrated circuit according to claim 3, wherein the control circuit is configured to receive the digital value from the measuring circuit and comprises a memory configured to store the digital value.

5. The integrated circuit according to claim 1, wherein the measuring circuit comprises a test signal source coupled to the output terminal, the test signal source being configured to supply a test signal to the output terminal.

6. The integrated circuit according to claim 5, wherein the value of the test signal is selected to be below the forward voltage of the light-emitting diode or below the threshold current of the light-emitting diode.

7. The integrated circuit according to claim 5, wherein the test signal is a test current, and wherein the measuring circuit is configured to sense a voltage on the output terminal.

8. The integrated circuit according to claim 5, wherein the test signal is a test voltage, and wherein the measuring circuit is configured to sense a current flowing through the output terminal.

9. The integrated circuit according to claim 5, wherein the measuring circuit is configured to sense the signal value on the output terminal at least two different points of time relative to a point of time at which the test signal is activated.

10. An electronic device, comprising:

an integrated circuit, and a light-emitting diode coupled to an output terminal of the integrated circuit, wherein the integrated circuit comprises:

an output circuit coupled to the output terminal, the output circuit being configured to supply an operating signal to the light-emitting diode, a measuring circuit coupled to the output terminal, the measuring circuit being configured to sense on the output terminal a signal value outside an operating regime of the light-emitting diode, the signal value being a voltage below a forward voltage of the light-emitting diode or a current below a threshold current of the light-emitting diode, and a control circuit coupled to the measuring circuit, the control circuit being configured to configure at least one function of the integrated circuit when the signal value as sensed by the measuring circuit corresponds to a voltage below the forward voltage of the light-emitting diode or a current below the threshold current of the light-emitting diode.

11. The electronic device according to claim 10, comprising:

a configuration circuit coupled to the output terminal of the integrated circuit, the configuration circuit configured to set the signal value sensed on the output terminal.

12. The electronic device according to claim 11, wherein the configuration circuit comprises a configuration resistor.

13. The electronic device according to claim 12, wherein a resistance value of the configuration resistor is selected in a range between approximately 100Ω and 100 kΩ.

14. The electronic device according to claim 11, wherein the configuration circuit comprises a configuration capacitor.

15. The electronic device according to claim 11, wherein the measuring circuit comprises a test signal source coupled to the output terminal, the test signal source being configured to supply a test signal to the output terminal in such a way that a current through the output terminal substantially flows through the configuration circuit only.

16. The electronic device according to claim 10, wherein the output circuit comprises a light-emitting diode driver.

17. A method of configuring an integrated circuit, comprising:

coupling a light-emitting diode to an output terminal of the integrated circuit, sensing on the output terminal a signal value outside an operating regime of the light-emitting diode, the signal value being a voltage below a forward voltage of the light-emitting diode or a current below a threshold current of the light-emitting diode, and controlling at least one function of the integrated circuit when the sensed signal value corresponds to a voltage below the forward voltage of the light-emitting diode or a current below the threshold current of the light-emitting diode.

18. The method according to claim 17, comprising:

coupling a configuration circuit to the output terminal, the configuration circuit configured to set the signal value sensed on the output terminal.

19. The method according to claim 18, comprising:

supplying a test signal to the output terminal, the test signal being selected in such a way that a current through the output terminal substantially flows through the configuration circuit only.

20. The method according to claim 19, wherein the test signal is a current, and wherein the sensed signal value is a voltage level on the output terminal.

21. The method according to claim 19, wherein the test signal is a voltage, and wherein the sensed signal value is a current flowing through the output terminal.

22. The method according to claim 19, comprising:

sensing the signal value at least two different points of time relative to a point of time at which the test signal is activated.

23. The method according to claim 17, comprising:

converting the sensed signal value into a digital value and storing the digital value as configuration data.

24. An integrated circuit, comprising:

a terminal to be coupled to a light-emitting diode, a light-emitting diode driver coupled to the terminal, a measuring circuit coupled to the terminal, the measuring circuit being configured to sense a voltage and/or a current generated on the terminal in response to a test signal, an analog-to-digital converter configured to convert the sensed voltage and/or current into a digital value, and a memory configured to store the digital value as configuration data of the integrated circuit, wherein the test signal is selected in such a way that the voltage across a light-emitting diode coupled to the terminal is below the forward voltage of the light-emitting diode.

25. The integrated circuit according to claim 24, comprising:

a controller configured to configure at least one function of the integrated circuit on the basis of the stored configuration data.

* * * * *